(12) United States Patent
Pan

(10) Patent No.: US 6,410,888 B2
(45) Date of Patent: *Jun. 25, 2002

(54) PROCESS CHAMBER COOLING

(75) Inventor: Chenyu Pan, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/846,668

(22) Filed: Apr. 30, 2001

Related U.S. Application Data

(63) Continuation of application No. 09/454,377, filed on Dec. 3, 1999, now Pat. No. 6,259,062.

(51) Int. Cl.$^7$ .................................................. F27B 5/14
(52) U.S. Cl. ........................ 219/390; 219/405; 219/411; 118/724; 118/725; 392/416; 392/418
(58) Field of Search ............................... 219/390, 405, 219/411; 118/724, 725, 501; 392/416, 418

(56) References Cited

U.S. PATENT DOCUMENTS

| | | | |
|---|---|---|---|
| 4,558,660 A | * 12/1985 | Nishizawa et al. ......... | 118/725 |
| 4,811,493 A | 3/1989 | Burgio, Jr. | |
| 4,949,783 A | 8/1990 | Lakios et al. | |
| 5,033,407 A | 7/1991 | Mizuno et al. | |
| 5,181,556 A | 1/1993 | Hughes ....................... | 118/725 |
| 5,259,883 A | * 11/1993 | Yamabe et al. ............. | 118/725 |
| 5,447,431 A | 9/1995 | Muka | |
| 5,520,538 A | 5/1996 | Muka | |
| 5,520,742 A | 5/1996 | Ohkase | |
| 5,561,735 A | 10/1996 | Camm ......................... | 392/416 |
| 5,778,968 A | 7/1998 | Hendrickson et al. | |
| 5,937,541 A | 8/1999 | Weigand et al. | |
| 5,960,158 A | * 9/1999 | Gat et al. .................... | 392/416 |
| 5,991,508 A | 11/1999 | Ohmine et al. ............. | 392/418 |
| 6,054,684 A | * 4/2000 | Pas et al. ..................... | 219/390 |
| 6,259,062 B1 | * 7/2001 | Pan ............................. | 219/390 |

FOREIGN PATENT DOCUMENTS

| | | |
|---|---|---|
| JP | 62282437 | 12/1987 |
| JP | 07045536 | 2/1995 |

* cited by examiner

Primary Examiner—Teresa Walberg
Assistant Examiner—Shawntina T. Fuqua
(74) Attorney, Agent, or Firm—Knobbe, Martens, Olson & Bear LLP

(57) ABSTRACT

A method is provided for the rapid. cooling of a processed semiconductor wafer after a wafer heating by radiation process. The method includes the introduction of a radiation absorbing material element between the processed wafer and highly reflective surfaces—after a wafer heating by radiation process. The highly reflective surfaces reflect and re-direct radiant energy from the processed wafer and its surrounding components back to the processed wafer, impeding its cooling process. The radiation-absorbing material element, once between the processed wafer and the highly reflective surfaces, absorbs radiation from the processed wafer and its surrounding components, expediting their cooling process. Accordingly, significant time is saved for the cooling process, thus improving overall wafer throughput.

16 Claims, 3 Drawing Sheets

PROCESS CHAMBER COOLING

REFERENCE TO RELATED APPLICATION

This application is a continuation of application Ser. No. 09/454,377, filed Dec. 3, 1999, now U.S. Pat. No. 6,259,062, which is owned by the assignee of record, ASM America, Inc.

FIELD OF THE INVENTION

This invention relates generally to equipment for processing semiconductors, and more particularly to methods and apparatus for rapidly cooling substrates.

BACKGROUND OF THE INVENTION

There are numerous semiconductor process steps involved in the development of modem day integrated circuits (ICs). From the initial fabrication of silicon substrates to final packaging and testing, integrated circuit manufacturing involves many fabrication steps, including photolithography, doping, etching and thin film deposition. For many of these processes, temperature is a key factor for obtaining desired film properties and characteristics. Characteristics of thin film metals and dielectrics affect electronic properties such as resistive and capacitive values, thus directly affecting IC performance characteristics such as device speed and power consumption.

In most semiconductor processes, heating by radiation is the preferred mode for heating because of its rapid heating capability compared to heating by conduction and convection. In a system where single wafers, or wafer batches are being processed, wafer throughput would be directly affected by the rate at which each wafer or each batch of wafers are heated and subsequently cooled. In such systems where heating by radiation is employed, a rapid cooling method should compensate to otherwise not compromise the high wafer throughput achieved by the rapid heating by radiation process.

SUMMARY OF THE INVENTION

These and other needs are satisfied by several aspects of the present invention.

In accordance with one aspect of the invention, a workpiece is placed on a support or susceptor within a process chamber, and processed to an elevated temperature. A radiation-absorbing medium or material element is positioned between a reflective surface and the workpiece after a semiconductor process. The material element is spaced from the workpiece more than about 5 mm. The medium allows for the processed workpiece to cool from the elevated temperature.

In accordance with another aspect of the invention, a method is provided for processing a substrate in a semiconductor-processing chamber. A semiconductor substrate is placed on a substrate support within the processing chamber. A radiation-absorbing material element is positioned between a reflective surface and the substrate after heating of the wafer, outside the processing chamber.

In accordance with another aspect of the invention, a high temperature processing apparatus is provided, including a processing chamber and support the chamber for supporting a substrate. A plurality of heat sources are positioned outside the processing chamber to provide radiant energy to the substrate. A highly reflective surface placed outside the heat sources promotes an efficient conveyance of radiated energy to the substrate. A movable radiation-absorbing material element is included. The apparatus is configured to move the movable element from a process position that does not interfere with heating the substrate during a fabrication process to a post-process position between the reflective surface and the substrate after the fabrication process.

Advantageously, the preferred method provides significant time savings over previous methods by expediting the cooling process of a wafer after a semiconductor process is completed. The introduction of a radiation-absorbing material element between the reflective surfaces and the wafer inhibits radiation from returning to the wafer, which would generally slow the cooling rate of the processed wafer. Conversely, rapid cooling of processed wafers thus improves overall wafer throughput.

BRIEF DESCRIPTION OF THE DRAWINGS

Further objects and advantages of the invention will become apparent from a consideration of the drawings and ensuing description in which.

DETAILED DESCRIPTION OF THE PREFERRED EMBODIMENT

Figure 1:
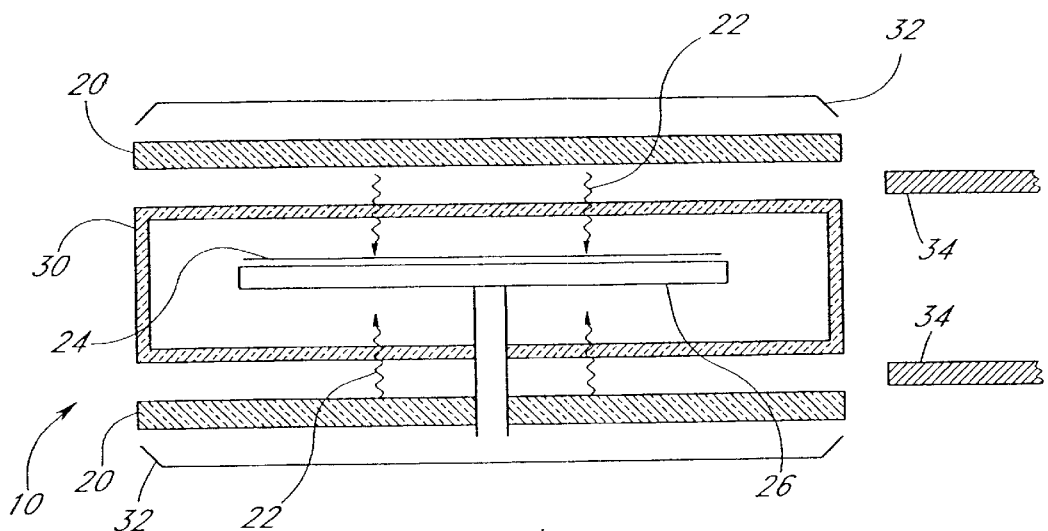
FIG. 1 is a schematic view of a process chamber during a high temperature process, wherein a workpiece is being heated.

As noted above, a large number of fabrication processes of semiconductor devices and components involve heating and cooling. Productivity or throughput is sometimes dependent upon how fast a process or a system heats or cools.

In many processes, such as rapid thermal processes (RTP), radiation is the primary means of heating substrates. The systems are designed such that the majority of radiation is contained within the system by multiple reflection to facilitate the heating. With the presence of highly reflective coatings in the process system, energy from the radiant heat sources will be reflected and efficiently re-directed towards the wafer.

Similarly, as substrates are being processed, or thereafter, radiation from the heated substrate would also irradiate energy and would as a consequence reflect against the highly reflective coatings. During a semiconductor heating process, reflection of radiation from the heated substrate would further enhance the heating rate of the substrate being processed.

Conversely, however, containing radiation within the system by multiple reflection significantly impedes the cooling process. Many processes prefer cooling of the heated substrate by turning off or attenuating the energy from the radiant heat sources and by not introducing a separate cooling agent. Reflection of the radiated energy emitted by the heated substrate would thus impede the cooling of the heated substrate. The result is a slow cooling which directly limits the fabrication productivity or throughput.

In general, heat transfer processes occur by three basic mechanisms or modes—conduction, convection and radiation. Heat transfer by radiation ($q_r$), which can be either heat emitting or absorbing, is expressed by the equation $q_r = \sigma A \epsilon T^4$ where $\sigma$ is the Stefan-Boltzmann constant, A the surface area of the heat transfer body, $\epsilon$ the emissivity, and T the absolute temperature of the heat transfer body. Therefore, heat transfer by radiation can be more significant at high temperature ranges than heat transfer by conduction or convection—both of which are proportional only to the first power of the temperature. This equation also indicates that heat transfer by radiation can be enhanced by increasing the surface area and by using high emissivity material. In addition, heat transfer by radiation is in the form of electromagnetic waves, which unlike conduction and convection, does not involve a material medium through which energy travels. Therefore, radiation can be transmitted, reflected and absorbed.

A typical process module comprises elements such as heat sources, process chambers, susceptors, ring assemblies, highly reflective coatings and wafers. Most semiconductor processes involve heating of a semiconductor substrate or wafer to a desired elevated temperature. As a result, process modules are designed to efficiently convey energy from a heat source to the wafer plane by placing a heat source directly above, and sometimes below the wafer. Typically, wafers are placed on a wafer support or susceptor within a process chamber. The chamber houses the susceptor and ring-assembly, and allows for a robot arm to insert and retrieve semiconductor wafers for processing.

Preferred Process Chamber

FIG. 1 shows a process module 10, including a quartz process chamber 30, constructed in accordance with a preferred embodiment, and for which the methods disclosed herein have particular utility. The process module design can be employed for CVD of a number of different types of layers, including epitaxial deposition of silicon on a single substrate at a time.

A plurality of heat sources are supported outside the process chamber 30, to provide heat energy to the process chamber 30 and its contents without appreciable absorption by the quartz chamber 30 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

In the preferred embodiment, the plurality of heat sources comprises radiant heat lamps 20. In accordance with FIG. 1, the radiant heat lamps 20 are placed above and below the quartz process chamber 30, and are oriented parallel to the horizontal plane of the quartz process chamber 30. The above and below radiant heat lamps 20 are outside the process chamber 30, providing a radiant energy 22 in a direction towards the quartz process chamber 30 and its contents within.

A substrate, such as a silicon wafer 24, is shown supported within the quartz process chamber 30 upon a wafer support or susceptor 26. Note that while the substrate of the illustrated embodiment is a single crystal silicon wafer, it will be understood that the term "substrate" broadly refers to any surface on which a layer is to be deposited. The semiconductor wafer 24 and susceptor 26 within the quartz process chamber 30 are parallel to the horizontal plane of the quartz process chamber 30 and the radiant heat lamps 20.

A highly reflective surface 32 is preferably behind the radiant heat lamps, possibly surrounding above and below the quartz process chamber 30 and its contents therein. The highly reflective surface 32 promotes a more efficient conveyance of radiant energy from the radiant heat lamps 20 to the wafer 24 as symbolized by the lines 22 in FIG. 1. Moreover, radiant energy 22 emitted from within the quartz process chamber 30 may also reflect against the highly reflective surface 32 back towards the quartz process chamber 30 and its contents as indicated by radiation lines in both directions, in FIG. 2.

Figure 2:
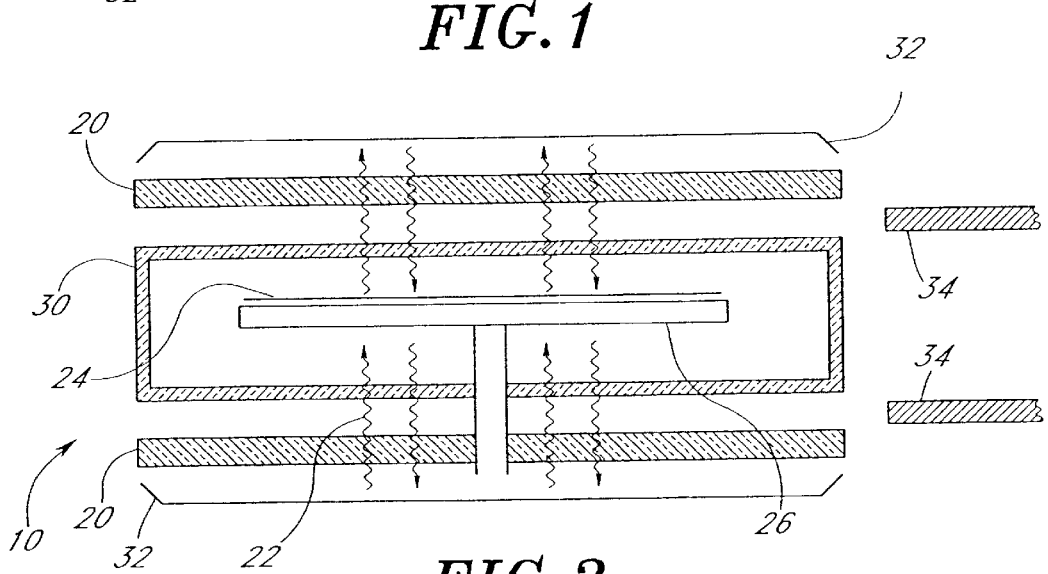
FIG. 2 is a schematic view of the process chamber of FIG. 1 after a semiconductor process, illustrating re-radiation and reflection of energy.
Figure 3:
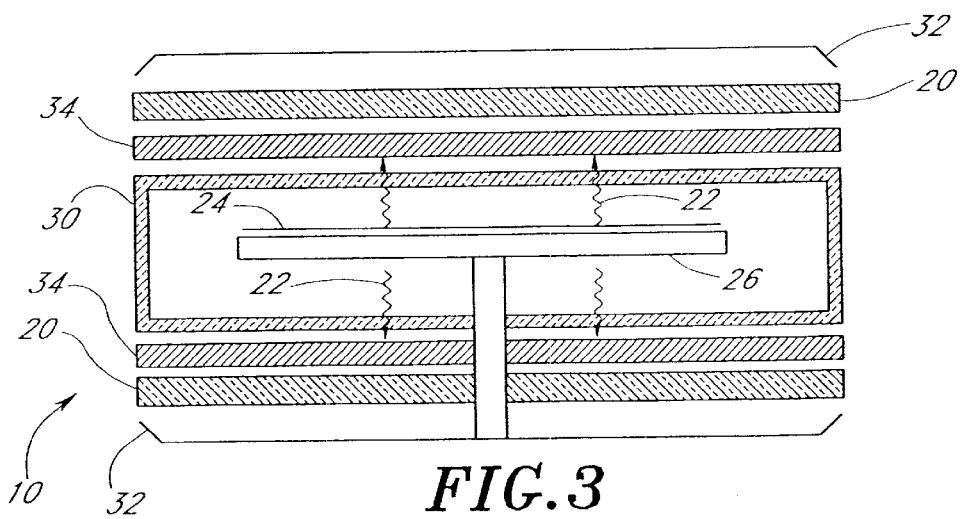
FIG. 3 is a schematic view of a process chamber constructed in accordance with a preferred embodiment, including a radiation absorption medium.

In FIGS. 1 and 2, moveable radiation-absorbing medium or material elements 34 are shown outside of the process module 10. In FIG. 3, the moveable material elements 34 are positioned inside the process module 10, aligned parallel to the horizontal plane of the quartz process chamber 30 and the radiant heat lamps 20, and positioned between the chamber and the lamps.

While the element 34 in FIG. 3 is outside the chamber 30, one of ordinary skill in the art will recognize the utility of the element 34 in other locations, including within the chamber 30. In an alternate embodiment, an absorption material element 34 may be introduced within the process chamber 30, but far enough away from the wafer 24 to minimize particle contamination of the wafer. Spacing between the material element 34 and the wafer 24 is preferably greater than about 2 mm, more preferably greater than about 5 mm and most preferably greater than about 1 cm.

In another alternate embodiment, the process chamber comprises a double-wall quartz chamber 44. In accordance with FIG. 4, the double-wall quartz chamber 44 comprises an inlet 38 and an outlet 40, through which a radiation absorption medium may flow. A radiation absorption medium such or as water 36 may flow in through inlet 38 and out through outlet 40 in a sheet-like formation as illustrated in FIG. 5. The laminar flow of the water 36 in a sheet-like formation is flushed between the walls of the double-wall quartz chamber 44 to cover preferably more than about 85%, more preferably more than about 90%, and most preferably more than about 95% of the surface area of each double-wall.

Semiconductor Process

Figure 6:
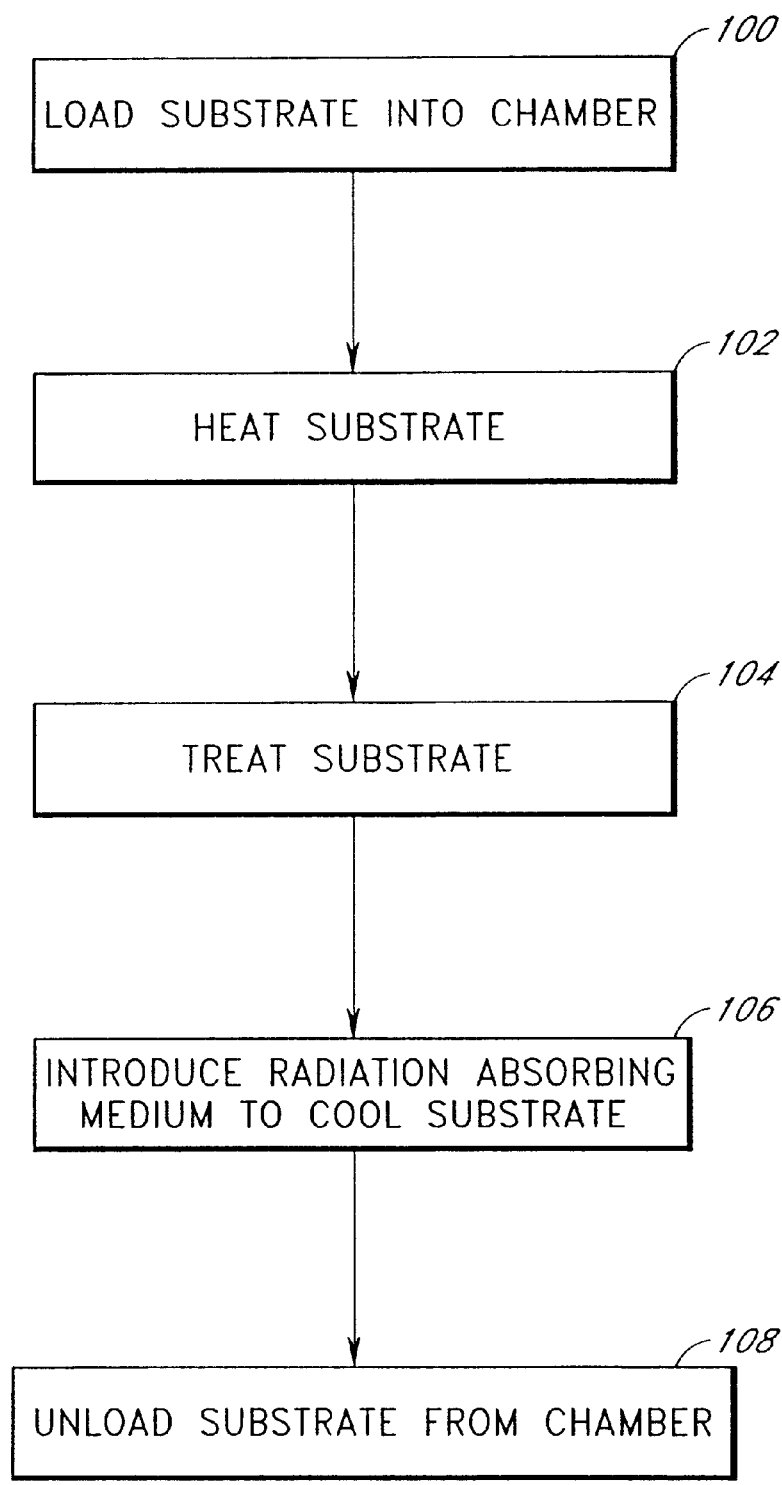
FIG. 6 is a flow chart generally showing steps for cooling wafers in accordance with the preferred embodiments.

As indicated in the flow chart of FIG. 6, a first step 100 in the preferred method is to load a substrate or semiconductor wafer 24 into the quartz process chamber 30 (FIG. 1). A load arm (not shown) inserts the semiconductor wafer into the quartz process chamber 30 and places it on the wafer support or susceptor 26. Once the semiconductor wafer 24 is secured on the susceptor 26, the robot arm retracts from the quartz process chamber, allowing for a semiconductor process to begin.

Referring again to the flow chart of FIG. 6, after a semiconductor wafer is loaded in the preferred quartz-processing chamber 30, a semiconductor process begins, which may include heating 102 a substrate. According to the illustrated embodiment of FIG. 1, the utilization of a radiant heat lamp 20 is the preferred method for the conveyance of a radiant energy 22 to a semiconductor wafer 24. The radiant heat lamps 20 may be turned on or raised to a desired elevated temperature for the desired semiconductor process to commence. Also, with the highly reflective surfaces 32, a more efficient conveyance of radiant energy 22 from the radiant heat lamps 20 to the semiconductor wafer 24 is promoted. Radiant energy 22 from the radiant heat lamps 20 reflect against the highly reflective surfaces 32 and bounce back towards the semiconductor wafer 24.

The next step in the preferred method illustrated in FIG. 6, is the treatment 104 of the semiconductor wafer. The desired elevated temperature may vary depending on the type of treatment 104 that the semiconductor wafer 24 will undergo. One particular wafer treatment is a CVD process called epitaxial deposition. Epitaxial deposition varies in deposition temperatures depending on the chemical sources used for silicon epitaxy. For example, when it is desirable to use silicon tetrachloride ($SiCl_4$) as a silicon source, the desired deposition temperature would range from about 1150–1250° C. Using $SiCl_4$ at that temperature range is advantageous in that very little deposition occurs on process chamber walls, thereby reducing the frequency of cleaning. This in turn also results in lower particulate contamination, since silicon flaking off the inside walls of the process chambers walls is minimized. There is, however, significant autodoping and outdiffusion at such high process temperatures, which is generally undesirable in the manufacturing of sensitive semiconductor devices.

Conversely, however, temperatures can range as low as 950–1050° C. when using silicon sources like silane ($SiH_4$). These lower temperatures ranges result in substantially less autodoping and outdiffusion when compared to films deposited at higher temperatures. The most important disadvantage of using $SiH_4$ at these temperatures, however, is that it can decompose at low temperatures, causing heavy deposits on process chamber walls. This, in turn, would necessitate in frequent cleaning of the process chamber, reducing its effective throughput. Other treatments include processes like etching, annealing and diffusion—all of which may vary in process temperature ranges.

Cooling Method

Most treatment processes commonly share the subsequent need to cool the wafer before it proceeds to its next process which may be a physical process, a chemical process, or a wafer transport process. After a wafer heating 104 process is completed, the wafer 24 is generally allowed to cool somewhat before the robot arm (not shown) retrieves the wafer 24 and delivers it to its next destination. Otherwise, the high temperature of the semiconductor wafer post processing may damage heat sensitive materials, such as plastic cassettes in which processed wafers are stored. Also, the robot arm may not be able to tolerate handling heated substrates at high process temperatures. Robot arms that can tolerate high process temperatures may also be too expensive. To cool the wafer after processing, the heat sources are turned down or off until the wafer is at least cool enough for the robot arm or wafer handler. Furthermore, in addition to simply cooling the semiconductor wafer to a safe temperature for transport and storage, cooling should be fast enough not to impede wafer throughput. For example, wafer throughput may be compromised by the radiant energy 22 emitted by the heated wafer 24. As illustrated in FIG. 2, the radiant energy 22 may emit from the processed wafer towards the highly reflective surfaces 32, and reflect back towards the processed wafer. As a result, the processed wafer 24 may exhibit a slow and impeded cooling.

The high wafer throughput requirement is satisfied in accordance with the illustrated embodiment of FIG. 3. Referring again to FIG. 6, the next step in the preferred method is to cool a semiconductor wafer 24 by the introduction 106 of a radiation-absorbing medium or material element 34. The ability of a surface to emit or absorb by radiation is known by the term emissivity. A perfect black body is an ideal body, which completely emits or absorbs radiant energy, and is defined as having an emissivity of 1.00, while all other surfaces have a lower emissivity expressed as a decimal value less than 1.00. Examples of mediums suitable for the material element 34 include solids, liquids and gasses, particularly those that have high emissivities in the infrared radiation. Water, for example, with an emissivity value ranging from 0.95–0.963, efficiently absorbs infrared radiation. The material element 34 is preferably selected to absorb the wavelength of light radiated by the heated wafer 24. This absorption feature advantageously enhances the cooling of energy emitting bodies such as the processed wafer 24 and support susceptor 26.

The moveable material element 34 is preferably utilized to cool the semiconductor wafer expeditiously to a safe-handling temperature. The utilization of a radiation-absorbing medium or material element 34 that efficiently absorbs infrared radiation after high temperature processing, specifically infrared radiation in the range of 10 $\mu$m, is the preferred method for rapid cooling of the processed wafer 24. The introduction of the material element 34 after the semiconductor processing will not inhibit the conveyance of radiant energy during process and will expedite the cooling of the wafer 24 and its surrounding components like susceptor 26. According to the illustrated embodiment of FIG. 3, a radiation-absorbing material element 34 is positioned on the either side of the quartz process chamber 30 and is parallel with wafer 24. When cooling of the energy emitting bodies within the process chamber 30 is needed, the radiation heat lamps 20 will be turned off or lowered, and the radiation absorbing material element 34 is moved to a position in between the radiant heat lamps 20 and the process chamber 30. Radiant energy 22 will be transferred from the energy emitting bodies, including the heated processed wafer 24 and support susceptor 26, to the material element 34, thus resulting in their expedited cooling.

Figure 4:
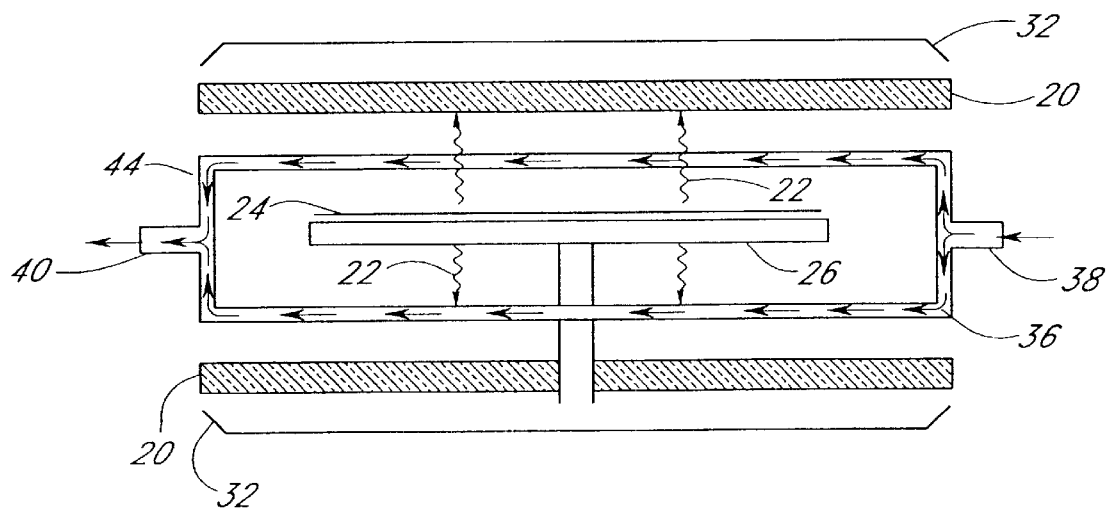
FIG. 4 is a schematic view of a process chamber constructed in accordance with another embodiment of the invention, having a sheet of water formed in a double-wall quartz chamber.
Figure 5:
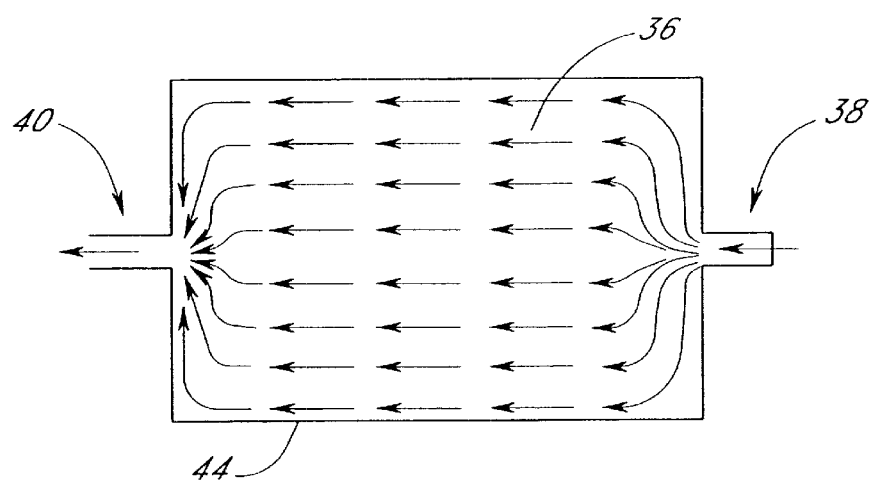
FIG. 5 is a schematic top view of a double-wall quartz chamber, illustrating the laminar flow of water in a sheet-like formation within the double-wall.

In accordance with another illustrated embodiment, FIG. 4 illustrates the utilization of water 36 as a means to absorb radiation. By means of a double-wall quartz chamber 44, water can be flushed within the walls of the double-wall quartz process chamber 44, acting as a high absorption material. Water is an efficient radiation absorption material, especially radiation in the infrared range. The double-wall quartz chamber 44 is preferably without water during the process duration of the wafer 24, allowing for an efficient conveyance of radiant energy 22 from the radiant heat lamps 20 to the wafer. After the process is completed, cooling of the processed wafer 24 is more preferably expedited by continuously flushing water 36 between the double-wall quartz chamber 44. The water 36 is conducted in through an inlet 38 and out through an outlet 40 of the double-wall quartz chamber 44. Referring to FIG. 5, water 36 preferably flushes through inlet 38 and spreads out in a sheet-like formation within the double-wall quartz chamber 44. The laminar flow of water 36 in a sheet-like formation is flushed between the walls of the double-wall quartz chamber 44 to cover preferably more than about 85%, more preferably more than about 90%, and most preferably more than about 95% of the surface area of each double-wall. The sheet like formation of the water 36 within the double-wall quartz chamber 44 advantageously allows for a greater absorption surface area. The laminar flow of water in a sheet-like formation absorbs radiant energy 22 from energy emitting bodies such as wafer 24 and susceptor 26, until the desired lowered temperature of the processed wafer 24 is reached expeditiously.

Referring again to the flow chart of FIG. 6, the next step in the preferred method is to unload 108 the processed wafer 24. After treatment 104 and subsequent cooling 106 of the semiconductor wafer, the load arm (not shown) may retrieve the processed wafer 24 for safe transport to its next destination, including the wafer handler (not shown) and/or wafer cassettes (not shown).

Once unloaded, the quartz process chamber 30 may be ready to load the next wafer 24 to be treated 102. Incidentally, for the next wafer 24 to be expeditiously ramped to its preferred process temperature range, FIG. 2 illustrates how the radiation-absorbing material element 34 may be returned to a location outside the process module. The material element 34 outside the process module allows for an efficient conveyance of radiant energy 22 from the radiant heat lamps 20 to the wafer 24 to be processed. Similarly, the water 36 between the double-wall process chamber 44 can then be emptied out for the next semiconductor wafer 24 to be processed.

Alternatively, absorption of radiated energy 22 from energy emitting bodies, such as the wafer 24 and susceptor 26 can also occur by introducing an absorption material element 34 within the process chamber. After a semiconductor process has taken place, and subsequent cooling is required, an absorption material medium 34 may be introduced within the process chamber 30, but far enough away from the wafer 24 to minimize particle contamination of wafer. Cooling by close proximity material placement, or conduction, is preferably avoided to minimize contamination opportunities.

Accordingly, several objects and advantages are inherent to the described invention. For example, radiation cooling by the utilization of a radiation absorbing material element is highly efficient and effective, particularly for systems or processes that are heated by radiation. Similarly, the use of the radiation absorbing material element will result in very fast cooling of the system or process, just as efficiently and effectively as rapid heating by radiation in the same system or process. The use of radiation absorbing material medium can also shorten process time and increase yield or throughput when cooling is involved in the process. Furthermore, the use of radiation absorbing material element can be more cost effective than other cooling methods, for example, increasing gas flows inside the system or process chamber. The use of radiation absorbing material medium can also enable a controlled cooling, if needed, by tuning the emissivity or radiation absorbing efficiency of the absorption medium; and the use of radiation absorbing material medium outside the process chamber will not cause contamination or particles to the systems or processes.

I claim:

1. A method of processing workpieces, comprising:
   placing a workpiece on a support within a process chamber;
   processing the workpiece at an elevated temperature;
   moving a radiation absorbing medium to a position between a reflective surface and the workpiece after processing the workpiece, the medium being spaced from the workpiece greater than about 5 mm; and
   allowing the workpiece to cool from the elevated temperature.

2. The method of claim 1, wherein the radiation absorbing medium is between a heat source and workpiece in the position.

3. The method of claim 1 wherein the medium is solid, liquid or gas having high emissivity, particularly in the infrared range.

4. A method of processing a semiconductor substrate, comprising:
   placing a substrate on a substrate support within a semiconductor process chamber;
   heating the substrate to a processing temperature; and
   moving a radiation absorbing medium to a position between a reflective surface and the substrate after heating the substrate, the position located outside the processing chamber.

5. The method of claim 4, wherein the radiation absorbing medium is between the radiant heat source and the substrate at the position.

6. The method of claim 4, further comprising removing the medium from the position prior to processing a subsequent substrate.

7. A high temperature processing apparatus, comprising:
   a processing chamber in which a substrate is placed for processing;
   a substrate support within the processing chamber for supporting the substrate;
   a heat source positioned outside the processing chamber to provide radiant energy to the substrate;
   a reflective surface of a high reflectivity coating displaced outside the heat source, enhancing the energy conveyance to the substrate; and
   a movable radiation-absorbing material element, wherein the apparatus is configured to move the movable element from a process position that does not interfere with heating the substrate during a fabrication process to a post-process position between the reflective surface and the substrate after the fabrication process.

8. The apparatus of claim 7 wherein the heat source comprises a plurality of radiant heat sources, disposed above and below the substrate.

9. The apparatus of claim 7 further comprising a plurality of reflective surfaces, disposed above and below the substrate.

10. The apparatus of claim 7 further comprising a radiation-absorbing medium positioned between the heat source and the substrate.

11. The apparatus of claim 7 wherein the chamber comprises a double-wall quartz chamber with a space between the double-walls.

12. The apparatus of claim 11 wherein the movable element comprises a movable radiation absorption medium between the double-wall.

13. The apparatus of claim 12 wherein the medium is water.

14. The apparatus of claim 7, wherein the process position is located outside the processing chamber.

15. The apparatus of claim 8, wherein the post-process position is located outside the processing chamber.

16. The apparatus of claim 7, wherein the medium speeds cooling of the substrate when in the post-process position.

* * * * *

UNITED STATES PATENT AND TRADEMARK OFFICE
CERTIFICATE OF CORRECTION

PATENT NO.     : 6,410,888 B2                                              Page 1 of 1
DATED          : June 25, 2002
INVENTOR(S)    : Pan It is certified that error appears in the above-identified patent and that said Letters Patent is hereby corrected as shown below:

<u>Column 1,</u>
Line 17, please replace "modem" with -- modern --.

Signed and Sealed this

Seventeenth Day of June, 2003

JAMES E. ROGAN
*Director of the United States Patent and Trademark Office*